United States Patent [19]
Chu et al.

[11] Patent Number: 6,107,839
[45] Date of Patent: Aug. 22, 2000

[54] HIGH INPUT IMPEDANCE, STROBED CMOS DIFFERENTIAL SENSE AMPLIFIER WITH DOUBLE FIRE EVALUATE

[75] Inventors: Jeff L. Chu, Westford; Daniel W. Bailey, Northborough, both of Mass.; Jason F. Cantin, West Chester, Ohio

[73] Assignee: Compaq Computer Corporation, Houston, Tex.

[21] Appl. No.: 09/241,003

[22] Filed: Feb. 1, 1999

[51] Int. Cl.$^7$ .................................................. G01R 19/00
[52] U.S. Cl. ........................ 327/51; 327/52; 327/54; 327/55; 327/57
[58] Field of Search ................................. 327/51, 52, 54, 327/55, 57, 62, 65; 365/205, 207

[56] References Cited

U.S. PATENT DOCUMENTS

| | | | |
|---|---|---|---|
| 4,910,713 | 3/1990 | Madden et al. | 365/189 |
| 5,506,524 | 4/1996 | Lin | 327/57 |
| 5,508,644 | 4/1996 | Branson et al. | 327/57 |
| 6,002,290 | 12/1999 | Avery et al. | 327/333 |
| 6,031,775 | 2/2000 | Chang et al. | 365/205 |

OTHER PUBLICATIONS

Chuang, Ching–Te et al., "SOI for Digital CMOS VLSI : Design Considerations and Advances," Proceedings of the IEEE, 86(4): 689–720 (Apr. 1998).

Glasser, Lance A., and Dobberpuhl, Daniel W., "The Design and Analysis of VLSI Circuits," (MA: Addison_Wesley Publishing), pp. 286–289 (1985).

Matson, M. et al., "A 600MHz Superscalar Floating Point Processor," Paper on EV6 Fbox given at European Solid–State Circuits Conference, (Sep. 1998).

Montanaro, James et al., "A 160–MHZ, 32–b, 0.5–W CMOS RISC Microprocessor," IEEE Journal of Solid–State Circuits, 31(11) 1703–1714 (Nov. 1996).

Jiang, June et al., "High–Performance, Low–Power Design Techniques for Dynamic to Static Logic Interface," Proceedings 1997 International Symposium on Low Power Electronics and Design, Monterey, CA, Aug. 18–20, 1997, pp. 12–17.

*Primary Examiner*—Tuan T. Lam
*Assistant Examiner*—Hiep Nguyen
*Attorney, Agent, or Firm*—Hamilton, Brook, Smith & Reynolds, P.C.

[57] ABSTRACT

The sense amplifier of the present invention senses the logic level of a digital data element that is conveyed using a low voltage swing signal. That sensing operation occurs relatively soon after the logic level of the data element begins to be established at the input of the sense amplifier. Such a sense amplifier is referred to as having increased sensitivity due to an improved common mode rejection ratio. The common mode rejection ratio is improved by turning-on a pair of evaluate transistors in a successive manner. The sense amplifier includes a pair of discharge paths for allowing a charge, stored on associated internal signals, to be discharged at a given rate that is proportional to voltage levels of the associated data signals. Those data signals are isolated from the discharge paths such that the associated logic levels are not affected by the above mentioned discharge operation. An evaluate unit is connected to the discharge paths and conveys a first portion of the above mentioned charge to electrical ground at an initial rate. At a later time, the evaluate unit conveys a second portion of charge to electrical ground at a subsequent rate, such that the sensitivity of the sense amplifier is improved.

38 Claims, 10 Drawing Sheets

HIGH INPUT IMPEDANCE, STROBED CMOS DIFFERENTIAL SENSE AMPLIFIER WITH DOUBLE FIRE EVALUATE

BACKGROUND OF THE INVENTION

Generally speaking, computer systems typically include one or more central processor units (CPUs). In order to reduce power consumption and increase the performance of those CPUs, selected signals are operated in a "low voltage swing" manner. Low voltage swing signals typically represent digital data with a representative voltage that is less than the supply voltage (Vdd) level. Low swing voltage signals are typically generated in true/complement pairs, referred to as "differential" pairs. The prior art sense amplifiers operate by sensing the voltage differential between the true/complement pair to determine the logic level of the signal.

For example, the circuitry of a CPU may be powered by a Vdd supply voltage of 2.0 Volts. An associated pair of low voltage swing signals may use a voltage of 2.0 Volts to represent logic high data and 1.6 Volts to represent logic low data. Such low voltage swing signals can increase performance because the amount of time to generate a voltage differential of 0.4 Volts is significantly shorter than to transition that signal from 0 to 2.0 Volts. A signal that transitions from 0 to 2.0 Volts (i.e., from Vss to Vdd) and from 2.0 to 0 volts is referred to as a "rail-to-rail" signal.

While low voltage swing signals present benefits to a CPU, they also add additional design requirements. For example, amplifiers referred to as "sense amplifiers" are utilized to detect the logic levels of low voltage swing signals. Those low voltage swing signals can represent digital data such as data read from a storage location in a Random Access Memory (RAM). When such a storage location is read, a pair of low voltage swing signals is presented to the sense amplifier. That sense amplifier is designed to detect the logic level represented by the low swing voltage signals and convert it, after sufficient set-up and hold times, to corresponding full swing or rail-to-rail voltage signals. The rail-to-rail voltage signals can subsequently be output from the RAM device.

It is desirable that very small voltage differences, between associated differential signal pairs, are detectable by such a sense amplifier. The smallest voltage differential that is capable of being detected or "sensed" is referred to as the "sensitivity" of the sense amplifier. A measure of a sense amplifier's sensitivity is referred to as the common mode rejection ratio. The common mode rejection ratio is the ratio of the sense amplifier's differential voltage gain to the common mode voltage gain.

Prior art sense amplifiers have exhibited a reduced amount of sensitivity, primarily due to reduced common mode rejection ratios. Such reduced sensitivity is undesirable since it delays the point in a data signal's transition where the associated logic level can be determined. Hence, reduced sensitivity delays the generation of a corresponding rail-to-rail output signal. For example, the sooner that a sense amplifier can detect that a data signal is transitioning from a logic high level to a logic low level, the sooner the associated output signal can be transitioned to the corresponding voltage level. Accordingly, it is desired that the common mode rejection ratio be as high as possible such that very small differential voltages can be resolved.

Prior art approaches to improving sense amplifier sensitivity have resulted in circuits that adversely affect the data lines that are being sensed. For example, such approaches typically include cross-coupled-transistor input stages. Those input stages include a pair of transistors wherein the gate terminal of one transistor and the drain terminal of the other transistor are connected to one of the data lines to be sensed. A similar arrangement is also connected to the other data line. When the sense operation is initiated, the transistors are turned on and current begins to flow from the drain to the source terminal of each transistor. Responsively, a voltage drop develops on the drain terminals of each transistor and is conveyed to the data signals connected thereto.

Such prior art approaches also include a number of evaluate transistors. Those evaluate transistors are turned-on in a successive manner such that the internal signals of the sense amplifier are discharged at an initial slow rate followed by a faster subsequent rate. By successively turning those evaluate transistors on, the sensitivity of the sense amplifier is improved.

SUMMARY OF THE INVENTION

When a sense operation is initiated in the above mentioned prior art approaches to improving sense amplifier sensitivity, current begins to flow from the drain to the source terminal of each input stage transistor. That current flow causes the data lines to be loaded down or, in other words, causes a relatively large voltage drop to develop on the data lines. Accordingly, when those data lines are driven by a memory cell of a RAM device, the data value stored therein can become permanently corrupted in response to that voltage drop. Accordingly, an approach is desired that improves the sensitivity of the sense amplifier without adversely affecting the associated data lines. Therefore, such a sense amplifier can be implemented in connection with a structure such as a RAM device without corrupting the memory locations therein.

The sense amplifier of the present invention senses the logic level of a data signal without causing such a voltage drop. The data signal presented to the sense amplifier is isolated in such a manner that logic levels developed thereon are not affected by operation of the sense amplifier. Also, the sensing operation occurs relatively soon after the logic level of the data signal begins to establish itself at the input of the sense amplifier. Such a sense amplifier is referred to as having increased sensitivity due to an improved common mode rejection ratio. The common mode rejection ratio is improved by turning-on a pair of evaluate transistors in a successive manner.

More specifically, a sense amplifier is provided that includes a pair of discharge paths for allowing a charge, stored on associated internal signals, to be discharged at a given rate that is proportional to voltage levels of the associated data signals. Those data signals are isolated from the discharge paths such that the associated logic levels are not affected by the above mentioned discharge operation. An evaluate unit is connected to the discharge paths and conveys a first portion of the above mentioned charge to electrical ground at an initial rate. At a later time, the evaluate unit conveys a second portion of charge to electrical ground at a subsequent rate, such that the sensitivity and speed of the sense amplifier is improved.

In more detail, the evaluate unit conveys the second portion of charge to electrical ground after a certain time delay has occurred since the first portion of charge was conveyed to electrical ground. That evaluate unit may include a pair of evaluate transistors connected by a delay unit that generates the time delay between conveyance of the first and second portions of charge to electrical ground. Also, the first and second discharge paths each include a transistor that has a gate terminal connected to one of a pair of data signals. Because the data signals are not connected to the source or drain terminals of those transistors, the gate terminals isolate the data signals' logic levels from being affected by the discharge of the associated internal signals.

In other embodiments, the first evaluate transistor has a greater effective impedance than the second evaluate transistor such that the above mentioned charges can be discharged at an initial rate when the first evaluate transistor is turned-on.

With a further embodiment of the present invention, the above mentioned charges are discharged at the subsequent rate when the second evaluate transistor is turned-on.

With another aspect of the present invention, the above mentioned initial rate is slower than the subsequent rate. Responsively, the common mode rejection ratio and sensitivity of the sense amplifier is improved.

With a further aspect of the present invention, the sense amplifier receives a pair of differential low voltage swing data signals such that an associated logic level is determined by sensing a voltage differential between those data signals.

Accordingly, with such a structure the common mode rejection ratio and the sensitivity of the sense amplifier is improved without imposing adverse effects on the data signals connected thereto.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Generally, the sense amplifier of the present invention senses the logic level of digital data that is conveyed using a pair of differential, low voltage swing signals. That sensing operation occurs relatively soon after the logic level of the data has been established at the input of the sense amplifier and can be performed based upon a small differential voltage. The input of the sense amplifier provides isolation to the digital data such that an associated logic level is not effected by the operation of the sense amplifier.

Such a sense amplifier is referred to as having increased sensitivity due to an improved common mode rejection ratio. The common mode rejection ratio is the ratio of the sense amplifier's differential voltage gain to the common mode voltage gain and is a measure of the sensitivity of the sense amplifier. The common mode rejection ratio is shown to be improved by turning-on a pair of evaluate transistors in a successive manner, as will be described below.

I. A Computer System

Figure 1:
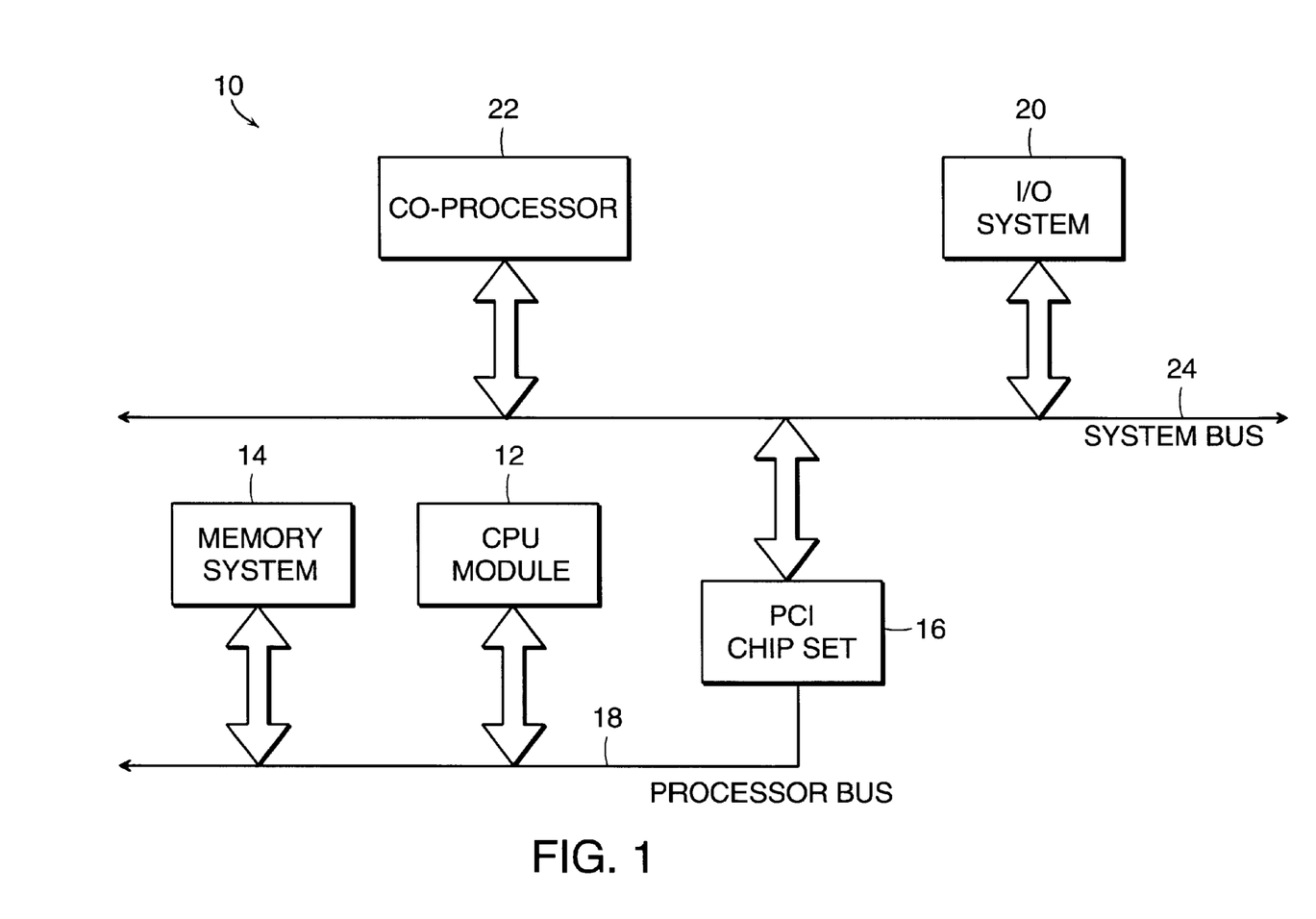
FIG. 1 is a schematic drawing of a computer system including a central processing module in which the present invention can be used.

FIG. 1 is a schematic diagram of a computer system 10 that includes a central processing unit (CPU) module 12, a memory system 14 and a PCI chip set 16 connected by a processor bus 18. The PCI chip set 16 is further connected to an I/O system 20 and a co-processor module 22 by a system bus 24. Central processing module 12 can include a number of sense amplifiers for use with low voltage swing signals according to the present invention.

Figure 2:
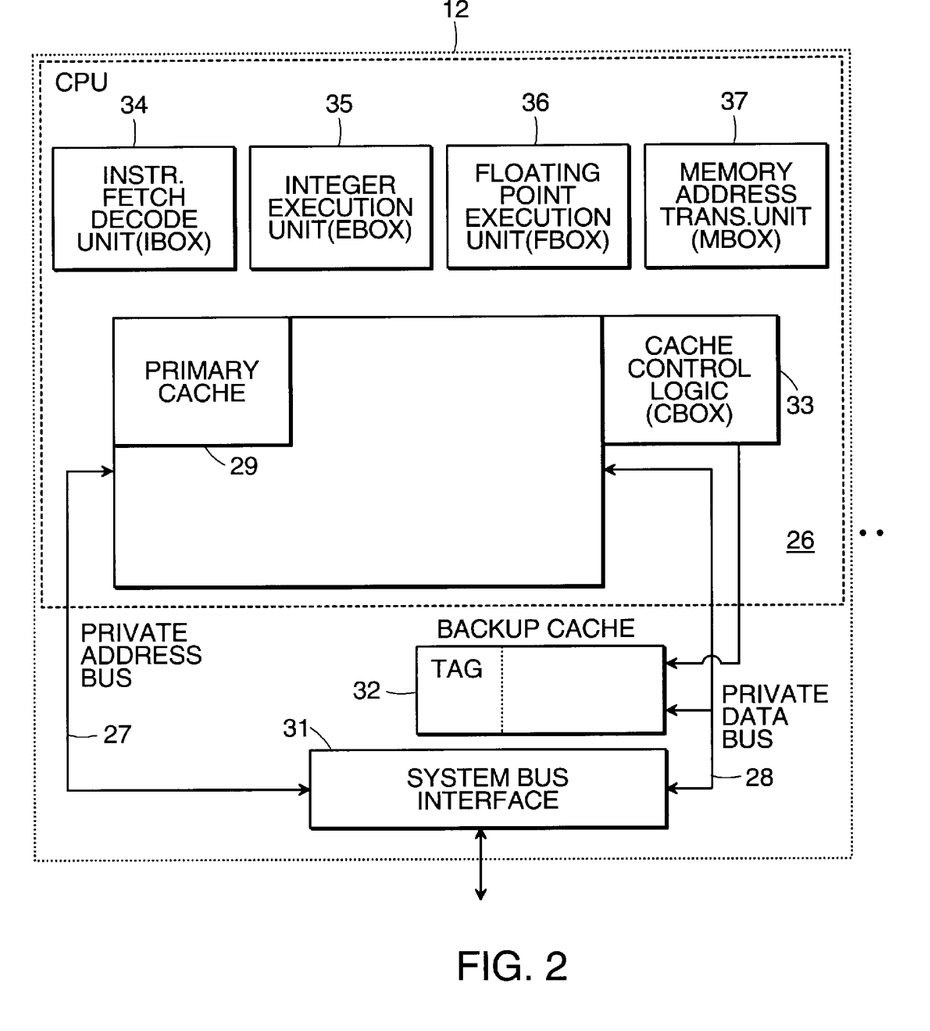
FIG. 2 is a schematic diagram of the central processing module of FIG. 1.

Referring now to FIG. 2, central processing module 12 is shown to include a central processing unit 26. A private address bus 27 and a private data bus 28 within CPU 26 connects a primary cache 29 and a system bus interface 31. The private data bus 28 connects the CPU 26 to a backup cache (Beache) 32 that, along with the primary cache 29, is controlled by cache control logic 33.

CPU 26 further includes several logic circuits that enable it to perform the major operations that the computer system 10 requires. The Ibox 34, or Instruction Fetch and Decode Unit, controls instruction prefetching, instruction decoding, branch prediction, instruction issuance, and interrupt handling. The Ebox 35, or Integer Execution Unit, handles the functions of addition, shifting, byte manipulation, logic operations, and multiplication for integer values stored in the system. These same operations, for floating point values, are controlled by the Fbox 36, or Floating Point Execution Unit. The Mbox 37, or Memory Address Translation Unit, translates virtual addresses, generated by programs running on the system, into physical addresses which are used to access locations in the computer system. Lastly, the Cbox 33, or Cache Control and Bus Interface Unit, controls the primary cache 29 and the backup cache 32. It also controls the private data bus, private address bus, memory related external interface functions, and all accesses initiated by the Mbox 37.

II. Ram Device using a sense amplifier

Figure 3:
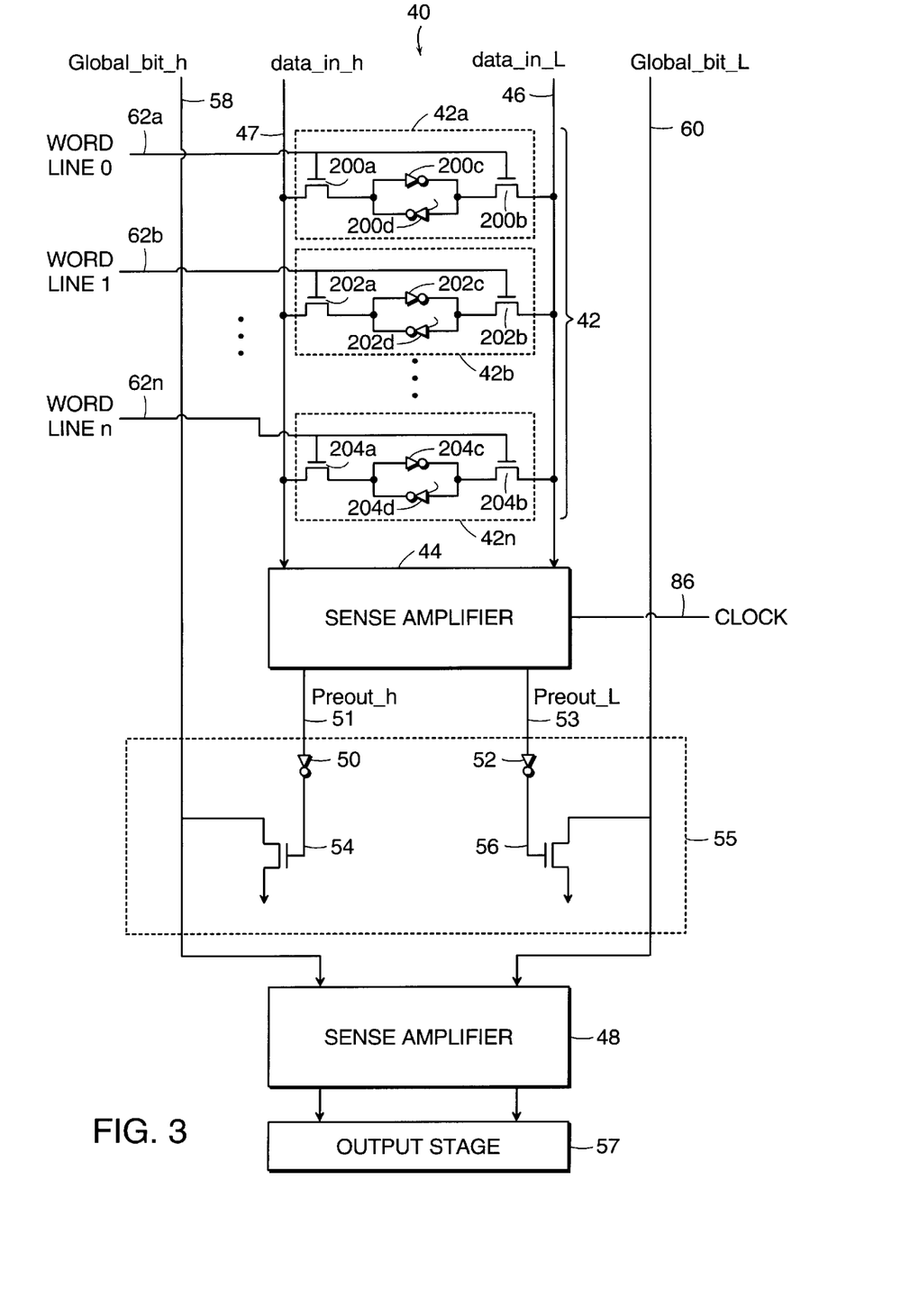
FIG. 3 is a schematic diagram of a RAM circuit such as contained in the central processing module of FIG. 2.

FIG. 3 is a schematic diagram of a memory cell configuration 40 contained in a Random Access Memory or RAM device. Such a RAM device is typically included in one or more of the above mentioned logic circuits 34–37 to provide data storage capabilities. Although a single column of memory cells 42a–42n is depicted, it will be recognized by those in the art that memory cell configuration 40 will be replicated many times in a typical RAM device.

During a read operation, differential pair signals data_in_1 46 and data_in_h 47 convey data from one of the memory cells 42a–42n to sense amplifier 44 in response to an assertion of one of the associated word lines 62a–62n. Differential pair signals data_in 1 46 and data_in_h 47 are typically low voltage swing signals and are isolated such that their voltage levels are not affected by the operation of sense amplifier 44.

Generally, when a read operation is initiated, the word line signal 62 that is associated with the desired memory locations is asserted. When a memory location, such as location 42a, detects the assertion of the word line signal 62a, transistors 200a and 200b are responsively turned-on. The data stored by the circularly connected inverters 200c and 200d is output on data lines 46 and 47 using a differential low swing voltage representation. That data is conveyed to sense amplifier 44 by signals data__in__l 46 and data__in__h 47. When the sense amplifier 44 senses that the data has been imposed on data__in__l 46 and data__in__h 47, it responsively generates a rail-to-rail voltage on signals preout__h 51 and preout__l 53.

Signal lines preout__h 51 and preout__l 53 are connected to another sense amplifier 48 by buffer stage 55 and by global__bit lines 58 and 60. The output signals from sense amplifier 48 are subsequently conveyed to an output stage 57 of the RAM device 40.

III. An Inventive Sense Amplifier

Figure 4:
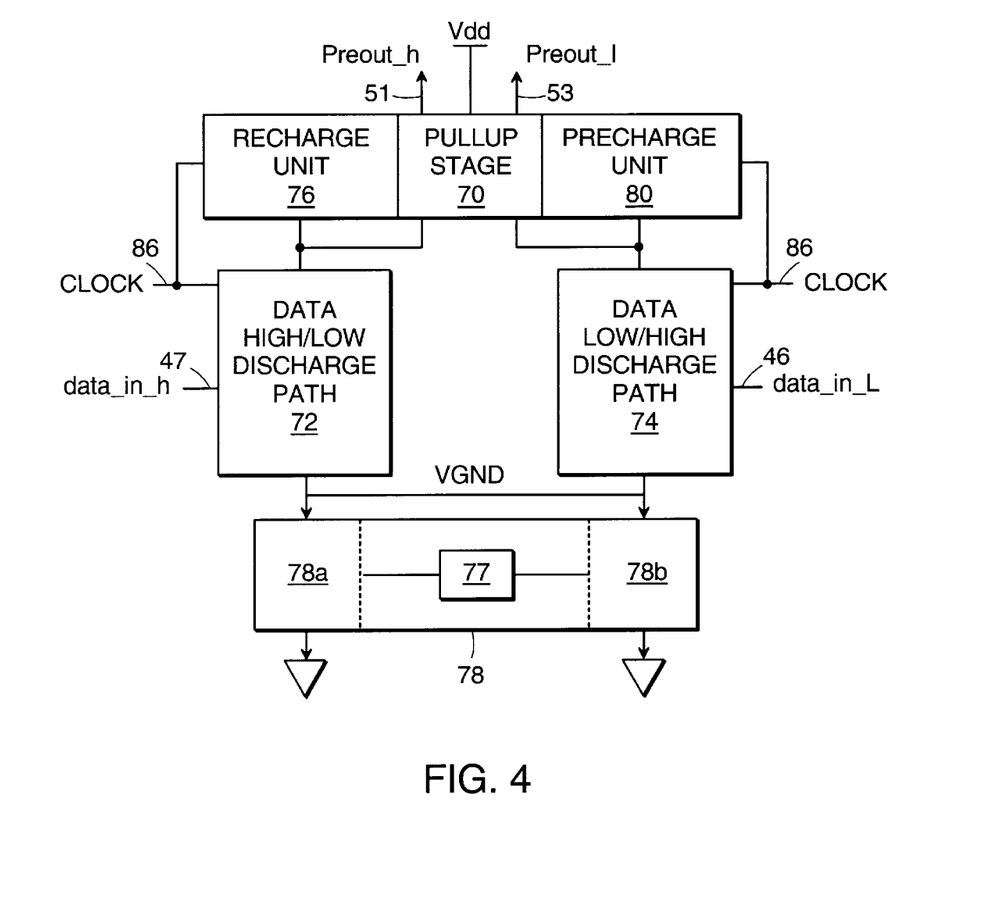
FIG. 4 is a block diagram of a sense amplifier, according to the present invention, that is included in the RAM circuit of FIG. 3.

Referring now to FIG. 4, a functional block diagram of sense amplifier 44 is shown to include pre-charge units 76 and 80 that are used for initializing or "pre-charging" the internal nodes of sense amplifier 44 to predetermined logic levels. The pre-charge units are connected to a clock signal 86 and pre-charge the internal nodes of the sense amplifier when that clock signal 86 transitions to a logic low level. Alternatively, when the clock signal 86 transitions to a logic high level, the pre-charge units are turned-off and evaluate circuit 78 is turned-on. Evaluate circuit 78 allows current to flow from the data low/high discharge path 74 and from the data high/low discharge path 72, to Vss or ground.

Depending upon the logic level represented by signals data__in__l 46 and data__in__h 47, one of the discharge paths 72 or 74 will discharge at a faster rate. Responsively, one of the associated output signals, preout__h 51 or preout__l 53, will be discharged at a faster rate. The output signal 51 or 53 that discharges the quickest will turn-on a portion of pull-up unit 70. That portion of pull-up unit 70 begins to pull the other output signal 51 or 53 to a logic high level. The faster discharging output signal 51 or 53 is allowed to continue to discharge. With the present embodiment, data signals 46 and 47 are isolated from the discharge paths. That isolation is achieved by connecting data signals 46 and 47 solely to the gate terminals of a pair of input transistors, as will be described below. Accordingly, the data signal 46 or 47 that is associated with the slower discharging output signal, 51 or 53, does not develop the voltage drop that occurs when that output signal begins to discharge and then is suddenly pulled-up to Vdd by the pull-up unit 70.

To improve the sensitivity of the sense amplifier, a first portion 78a of evaluate circuit 78 allows a small amount of charge to be initially discharged. Because of that reduced discharge amount, signal VGND initially discharges very slowly, increasing the common mode rejection ratio, and hence the sensitivity, of the sense amplifier. After a predetermined time delay imposed by delay circuit 77, a second portion 78b of discharge circuit 78 allows an increased amount of charge to be discharged. Responsively, signal VGND is discharged at an increased rate, i.e. decreasing the common mode rejection ratio at a point where increased sensitivity is no longer needed. Accordingly, sensitivity is increased at the initial part of the sensing operation, where the actual evaluation of data signals 46 and 47 is performed.

After the sensing operation is complete, the preout__l signal 53 will develop a rail-to-rail voltage that has the same polarity as data__in__l 46, and signal preout__h 51 will develop the complementary rail-to-rail voltage.

IV. Pre-Charge Operation

Figure 5:
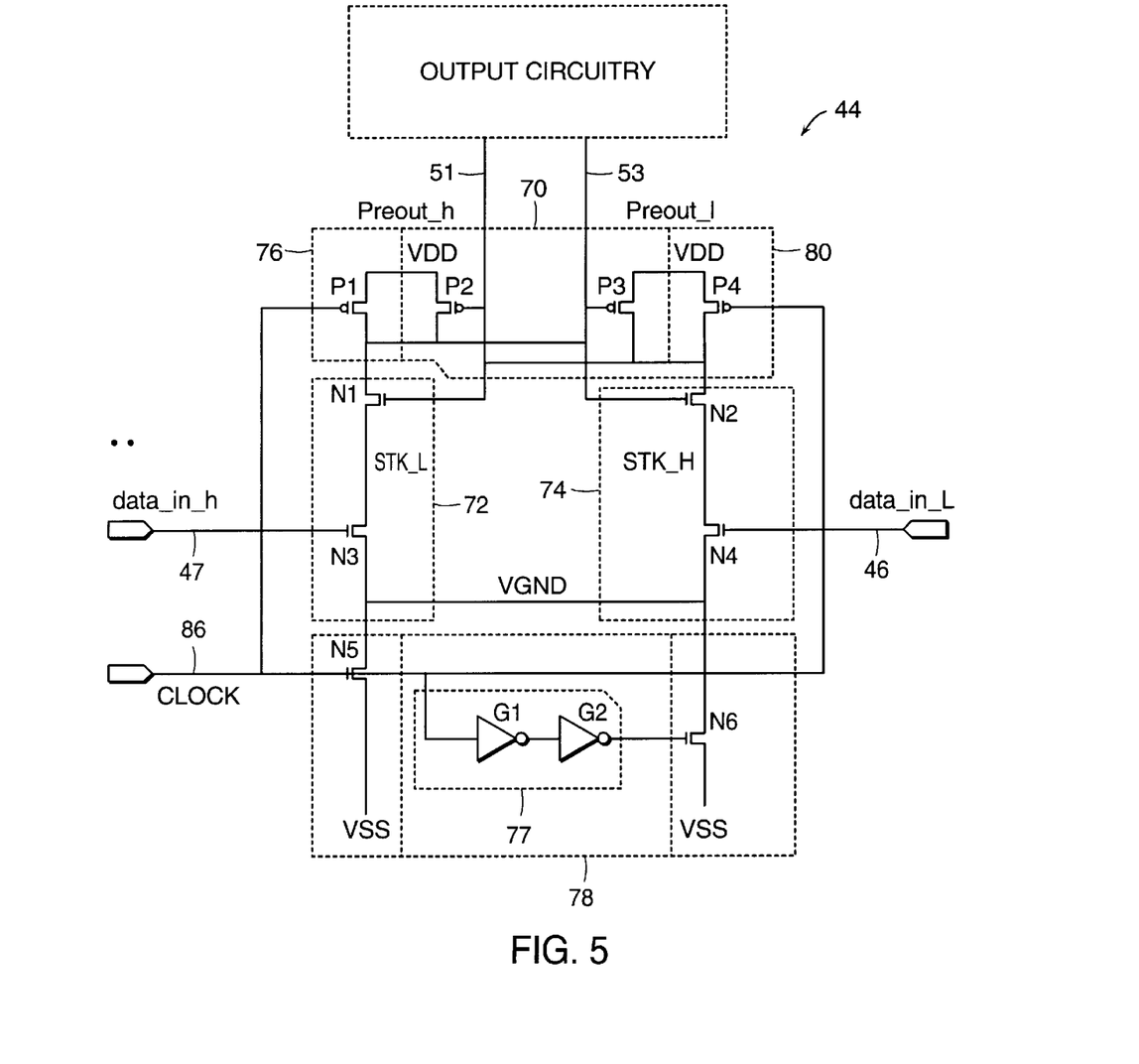
FIG. 5 is a schematic diagram of the sense amplifier of FIG. 4, according to the present invention.
Figure 6:
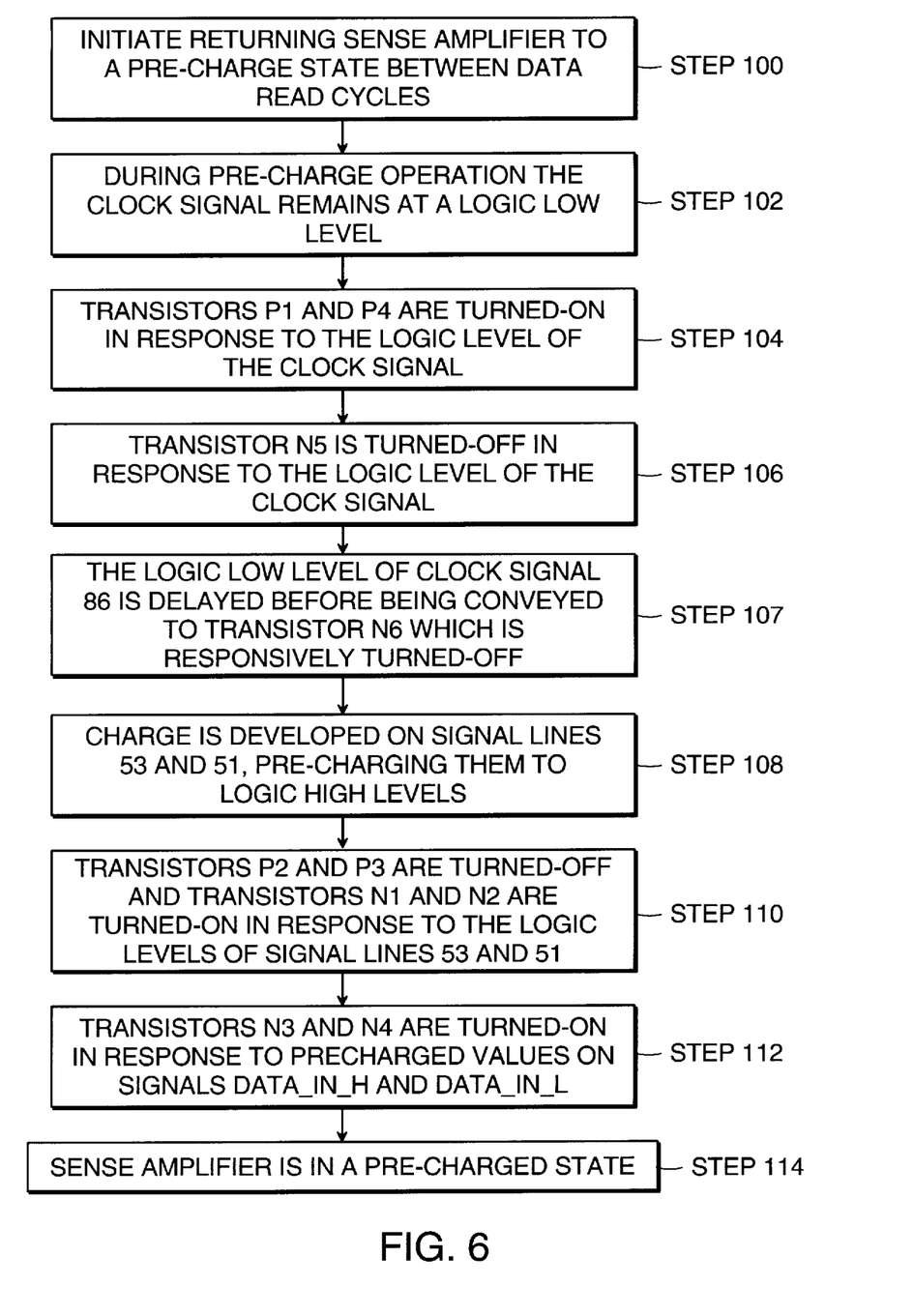
FIG. 6 is a flow diagram of the pre-charge operation of the sense amplifier of FIG. 5.

Referring now to the schematic diagram of FIG. 5 and the flow diagram of FIG. 6, the pre-charge operation of sense amplifier 44 will be described. Sense amplifier 44 returns to a reset or "pre-charge" state between each sensing operation. For example, in the instant embodiment, sense amplifier 44 returns to the pre-charge state between data read cycles (Step 100). In such a pre-charge state, the input clock signal 86 remains at a logic low level (Step 102). The clock signal 86 conveys that logic low level to the gate terminals of PMOS transistors P1 and P4, turning them "on" or, in other words, allowing current to flow from their source terminals to their drain terminals (Step 104). Also, NMOS transistor N5 receives the clock signal 86 and is turned "off" (Step 106). The logic low level of clock signal 86 is delayed by a pair of inverters before being presented to the gate terminal of NMOS transistor N6, which is responsively turned-off (Step 107). It should be noted that NMOS transistors N5 and N6 are referred to as the "evaluate" transistors.

When transistors P1 and P4 are turned-on in response to the logic level of clock signal 86, charge develops on signal lines preout__l 53 and preout__h 51, respectively (Step 108). Signal lines preout__l 53 and preout__h 51 are thereby pre-charged to logic high levels. Those logic levels are conveyed to the gates of PMOS transistors P2 and P3, which are responsively turned-off, and also conveyed to the gates of NMOS transistors N1 and N2, which are responsively turned-on (Step 110). It should be noted that, because the levels on signal lines data__in__h 47 and data__in__l 46 are precharged to the Vdd voltage level, a logic high level is conveyed to the gates of NMOS transistors N3 and N4 which are responsively turned-on (Step 112). Accordingly, signals STK__H, STK__L and VGND are pre-charged to logic high levels and sense amplifier 44 is referred to as being in a pre-charge state (Step 114).

V. Sense Amplifier Operation: data__in__l transition

Figure 7:
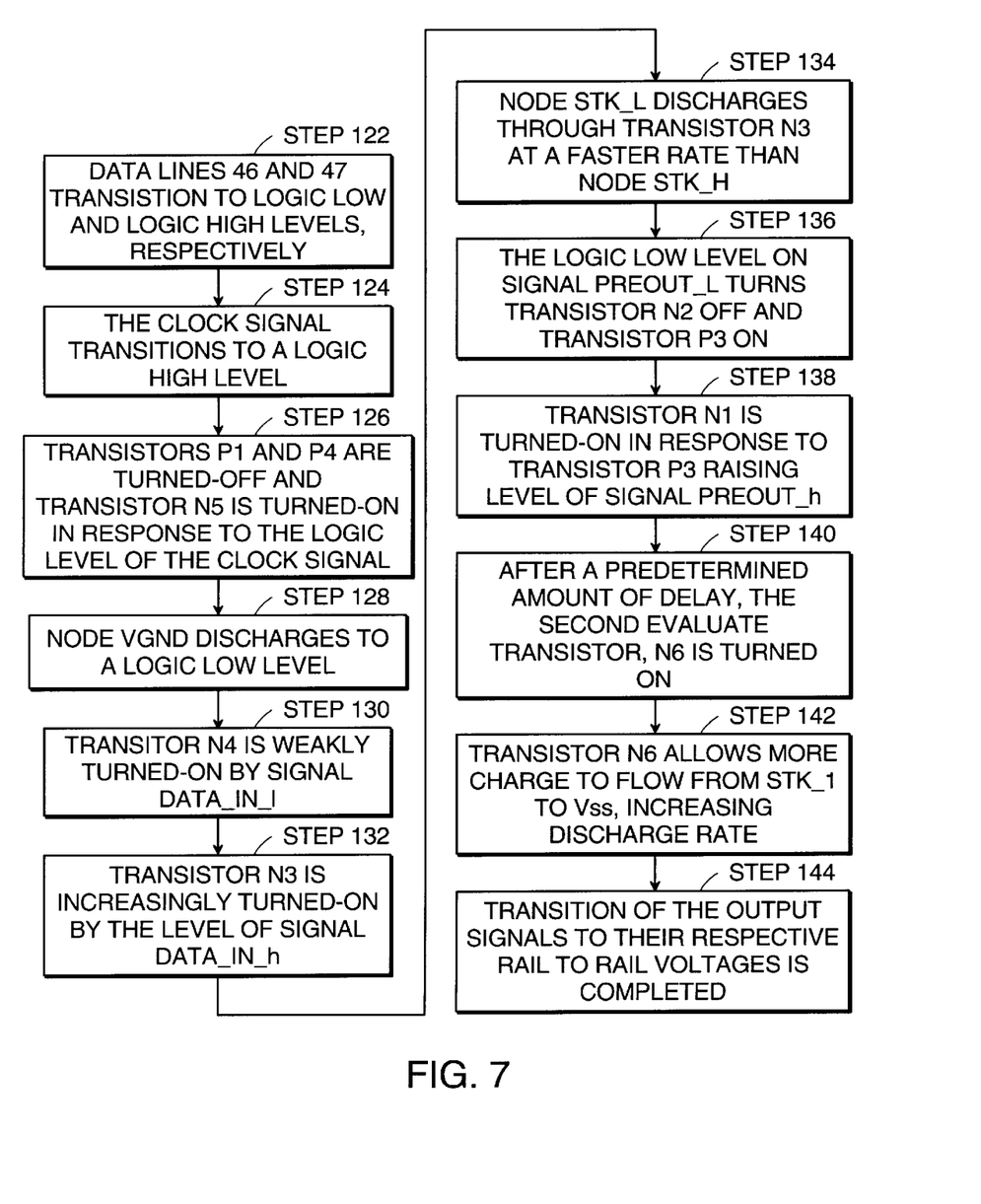
FIG. 7 is a flow diagram of the operation of the sense amplifier of FIG. 5, in response to data having a logic low level.

Referring now to the flow diagram of FIG. 7, the operation of sense amplifier 44 will be shown in response to signal data__in__l 46 transitioning from a logic high level to a logic low level.

Assuming that signals data__in__l 46 and data__in__h 47 are pre-charged to logic high levels, data will eventually be read from the memory cells 42 that will cause data signal 46 to transition to a logic low level (Step 122). Signals data__in__l 46 and data__in__h 47 are connected to the gate terminals of transistors N4 and N3, respectively. Accordingly, data signals 46 and 47 are isolated from discharge paths 74 and 72.

Prior art approaches to improving the sensitivity of sense amplifiers have included a number of evaluate transistors. Those evaluate transistors are turned-on in a successive manner such that the internal signals of the sense amplifier are discharged at an initial slow rate followed by a faster subsequent rate. By successively turning those evaluate transistors on, the sensitivity of the sense amplifier is improved. Such approaches have connected data signals, such as 46 and 47, to the gate and drain terminals of the input transistors, such as transistors N4 and N3. When those transistors are turned-on, current begins to flow from the drain to source terminals. A voltage drop responsively develops on each drain terminal and is conveyed to the data signal connected thereto. When the sense amplifier is implemented in a device such as a RAM device, that voltage drop is conveyed to the memory location that is driving the data signals. The data stored in that memory location is often corrupted.

However, in the sense amplifier 44 of the present invention, data signals 46 and 47 are solely connected to the gate terminals of the input transistors N4 and N3. Therefore, when sense amplifier 44 is performing a sense operation, the logic levels on data signals 46 and 47 are unaffected by the discharging of the internal signals and do not develop the large voltage drops that occur on those internal signals. Therefore, the memory cell 42 that is driving signals data_in_l 46 and data_in_h 47 is not adversely affected.

Accordingly, after data lines 46 and 47 have reached voltage levels that can be sensed by sense amplifier 44, clock signal 86 will transition to a logic high level (Step 124). That logic high level is conveyed to PMOS transistors P1 and P4, turning them off, and to NMOS transistor N5, simultaneously turning it on (Step 126).

NMOS transistor N5 has a source terminal connected to Vss (ground) and a drain terminal connected to node VGND. Therefore node VGND begins to discharge (Step 128). Because evaluate transistor N5 is a smaller device than would typically be used as an evaluate transistor, and hence has a higher effective resistance, the common mode rejection ratio of sense amplifier 44 is improved. Accordingly, since the sensitivity of sense amplifier 44 is related to improvements in the common mode rejection ratio, it is also improved. In other words, the effective resistance of transistor N5 allows the logic level of the differential pair of data signals 46 and 47 to be determined in response to a very small voltage difference. Subsequently, the logic high level of clock signal 86 is conveyed to transistor N6 by a pair of serially connected inverters G1 and G2. Transistor N6 is a larger transistor than evaluate transistor N5 and hence has a smaller effective resistance. When transistor N6 is fired, the common mode rejection ratio is reduced due to that transistor's smaller effective resistance. However, the logic level has already been sensed and therefore the increased sensitivity is no longer required. Accordingly, the decreased effective resistance of transistor N6 allows complementary signals STK_L and STK_H to quickly develop their respective logic levels, as will be described below.

Consider the point in the read cycle where transistor N6 has not yet been turned-on. The source terminals of NMOS transistors N3 and N4 are connected to a highly resistive path to Vss, through transistor N5. Because signal data_in_l 46 is transitioning to a logic low level, transistor N4 is only "weakly" turned-on, i.e. it can only conduct a small amount of current (Step 130). However, because data_in_h 47 is transitioning to a logic high level, NMOS transistor N3 will be increasingly turned-on and therefore conducts an increasing amount of current, i.e. more than transistor N4 (Step 132). Accordingly, signal line STK_L begins to discharge through transistors N3 and N5 at a faster rate than signal STK_H is discharged. In response, signal preout_l 53 begins to discharge through transistor N1 at a faster rate than signal preout_h 51 is discharged (Step 134).

When signal preout_l 53 reaches a logic low level, it is conveyed to the gate terminal of transistor N2, which is responsively turned-off. The logic low level on signal preout_l 53 is also conveyed to the gate terminal of transistor P3, which is responsively turned-on (Step 136). Note also that transistor P2 remains turned-off due to the slower discharge rate of signals preout_h 51 and signal STK_H. When transistor P3 is turned-on, it quickly raises preout_h 51 and the gate terminal of transistor N1 to a logic high level, thereby strongly turning N1 on and further increasing the discharge rate of signal preout_l 53 (Step 138).

After the logic levels of the differential pair of input signals 46 and 47 have been evaluated (i.e., after a predetermined amount of delay) the second evaluate transistor N6 is turned-on (Step 140). Transistor N6 allows an increased amount of charge to discharge from signal line STK_L to Vss, thereby increasing the discharge rate of that signal and allowing the output signals to resolve to their respective rail-to-rail voltages (Step 142). In other words, after the differential voltage between data_in_l 46 and data_in_h 47 is detected, increased positive feedback between the cross coupled transistors, due to the firing of transistor N6, completes the transition of the output signals to their respective rail-to-rail voltages (Step 144). Once the preout_h 51 and preout_53 signals have reached the final rail-to-rail voltages, subsequent changes to the input data signals do not affect those voltages.

VI. Sense Amplifier Operation: data_in_h transition

Referring now to the flow diagram of FIG. 8, the operation of sense amplifier 44 will be described in response to signal data_in_h 47 transitioning to a logic low level. For illustration purposes, consider that the sense amplifier 44 has been returned to the reset or pre-charge state in the manner previously described (see FIG. 6) (Step 114). In such a pre-charge state, the clock signal 86 remains at a logic low level.

When signal data_in_h 47 reaches a voltage level that can be distinguished by sense amplifier 44, the clock signal 86 transitions from a logic low level to a logic high level (Step 152). The clock signal 86 conveys that logic high level to the gate terminal of PMOS transistors P1 and P4, turning them off (Step 154). The clock signal 86 is also conveyed to NMOS evaluate transistor N5 which is turned-on or fired (Step 156). Because NMOS transistor N5 has its source terminal connected to Vss, node VGND begins to discharge through transistor N5 to a logic low level (Step 158).

At this point in the cycle, NMOS transistor N4 is turned-on and transistor N3 is turned-off due to the logic levels of signals data_in_l 46 and data in_h 47(Step 160). Therefore, node STK_L cannot discharge through transistor N3 (Step 162) and node STK_H begins discharging through transistors N4 and N5 to Vss (Step 164). Also, signal preout_h 51 begins to discharge through transistor N2 (Step 166). When signal preout_h 51 achieves a sufficiently low voltage, PMOS transistor P2 is turned-on and begins to pull signal preout_l 53 to a logic high level (Step 168).

Next, the logic level of clock signal 86 propagates through inverters G1 and G2 to the gate terminal of transistor N6, firing it (Step 170). When transistor N6 is fired, signals STK_H and preout_h 51 are discharged at an increased rate. Responsively, transistor P2 is increasingly turned-on, further pulling up signal preout_l 53 (Step 172). Accordingly, signals preout_l 53 and preout_h 51 finish transitioning to the rail-to-rail voltages Vdd and Vss, respectively (Step 174).

Figure 8:
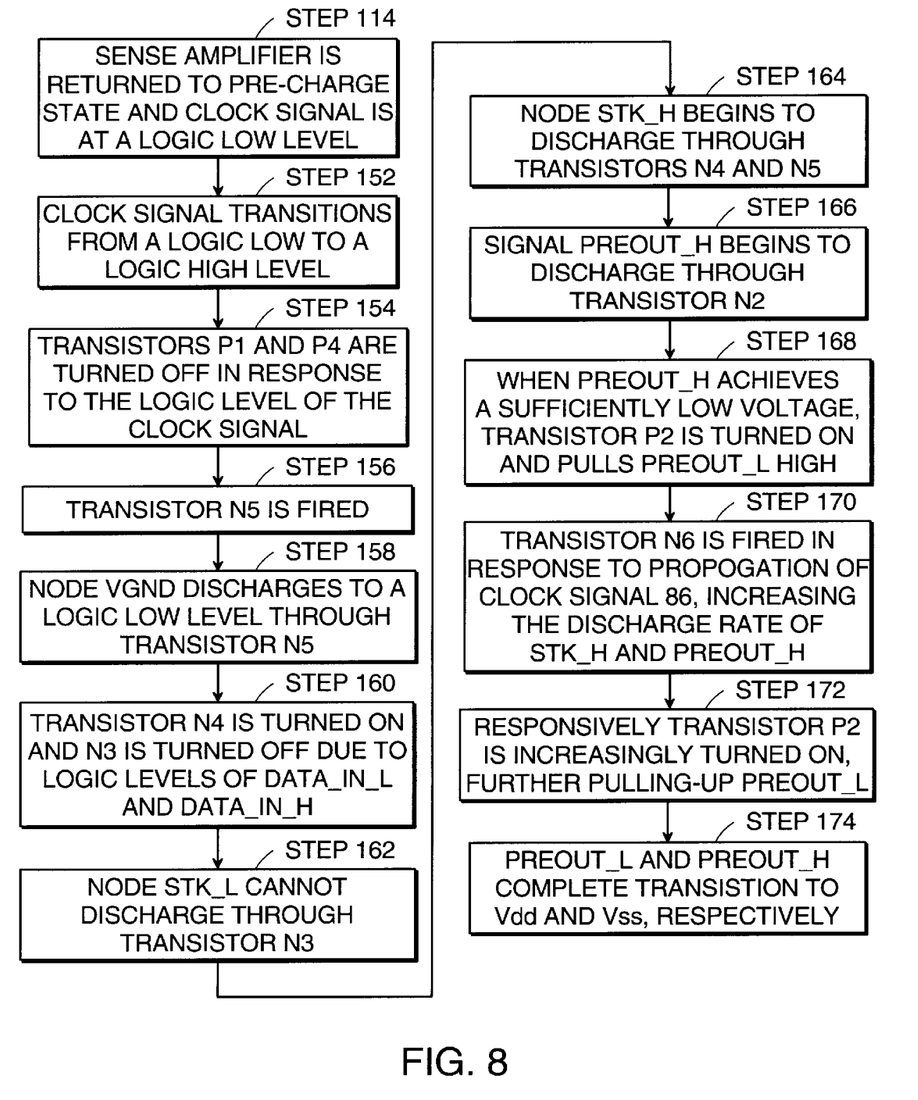
FIG. 8 is a flow diagram of a further operation of the sense amplifier of FIG. 5, in response to data having a logic high level.
Figure 9:
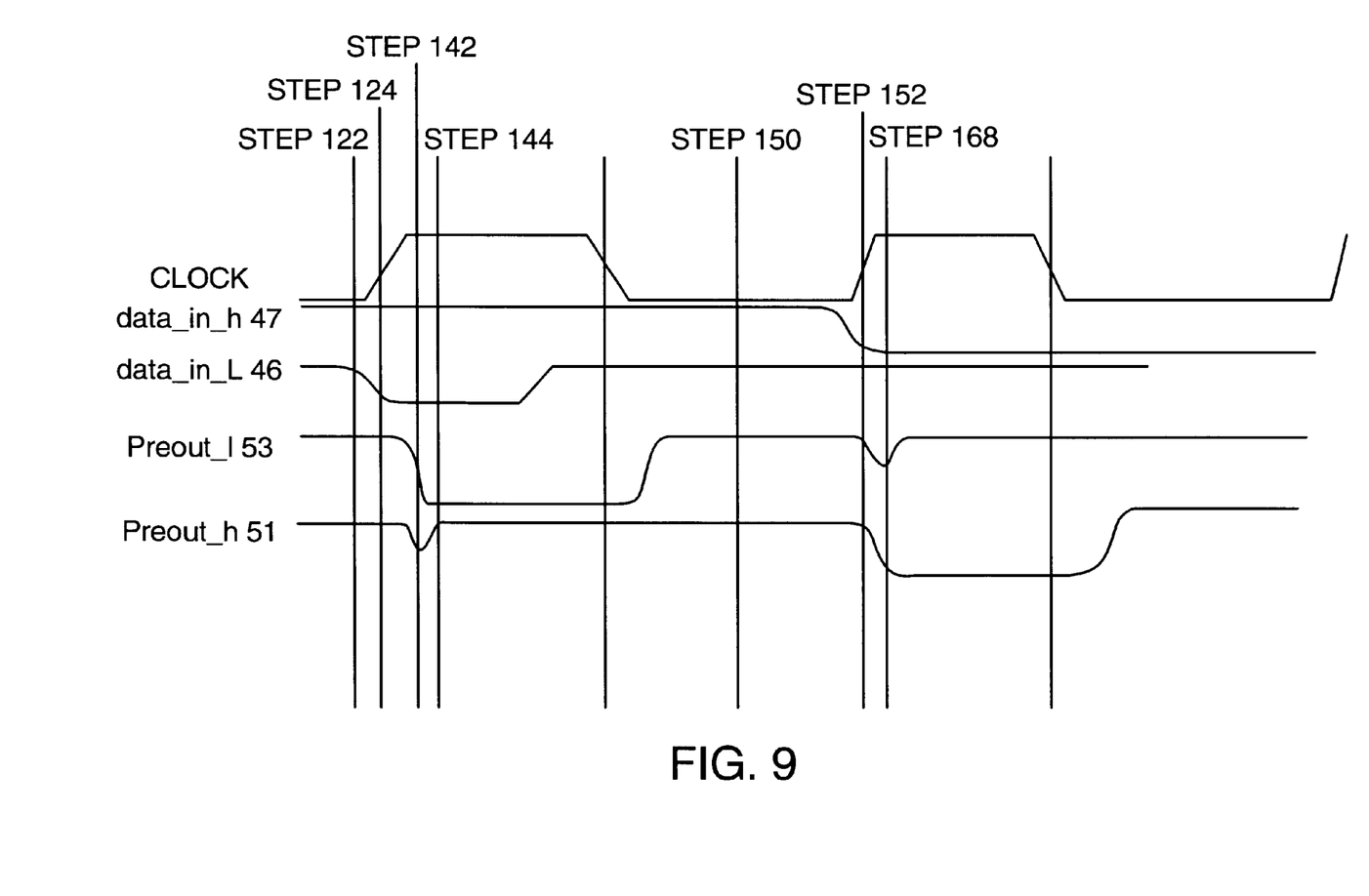
FIG. 9 is a timing diagram of the operation of the sense amplifier of FIG. 5.

Referring briefly to the timing diagram of FIG. 9, the timing waveforms of signals clock 86, data_in_h 47, data_in_l 46, preout_l 53 and preout_h 51 are shown in relation to the corresponding operational steps of FIGS. 7 and 8.

It will be recognized by one of ordinary skill in the art that the functionality of the inventive sense amplifier will be preserved if the NMOS and PMOS transistors are exchanged, along with the polarity of the associated logic signals. Further, the sense amplifier of the present invention is not limited to implementation in the read port of a RAM. To the contrary, the instant sense amplifier can be used in any circuit or application that utilizes a sense amplifier. For example, such circuits include edge-triggered latches and flip flops. Further still, the sense amplifier of the present invention can be used in implementations where the input data signals are rail-to-rail voltages.

Also, the delay between firing transistors N5 and N6 can be implemented using many other techniques for delaying an electrical signal. Those techniques could include any even number of serially connected inverters, a serial chain of turned-on pass gates, or any type of delay line circuitry.

VII. Alternative embodiment of the present invention

Sense amplifier 44 can provide a path from Vdd to Vss, through transistor N6, for a relatively short period of time between the turning-off of transistors N5 and N6. That effect is referred to as "crossover current" and can allow a significant amount of current to flow through transistors P4, N2, N4 and N6 or through transistors P1, N1, N3 and N6, depending upon which path was previously conducting.

Figure 10:
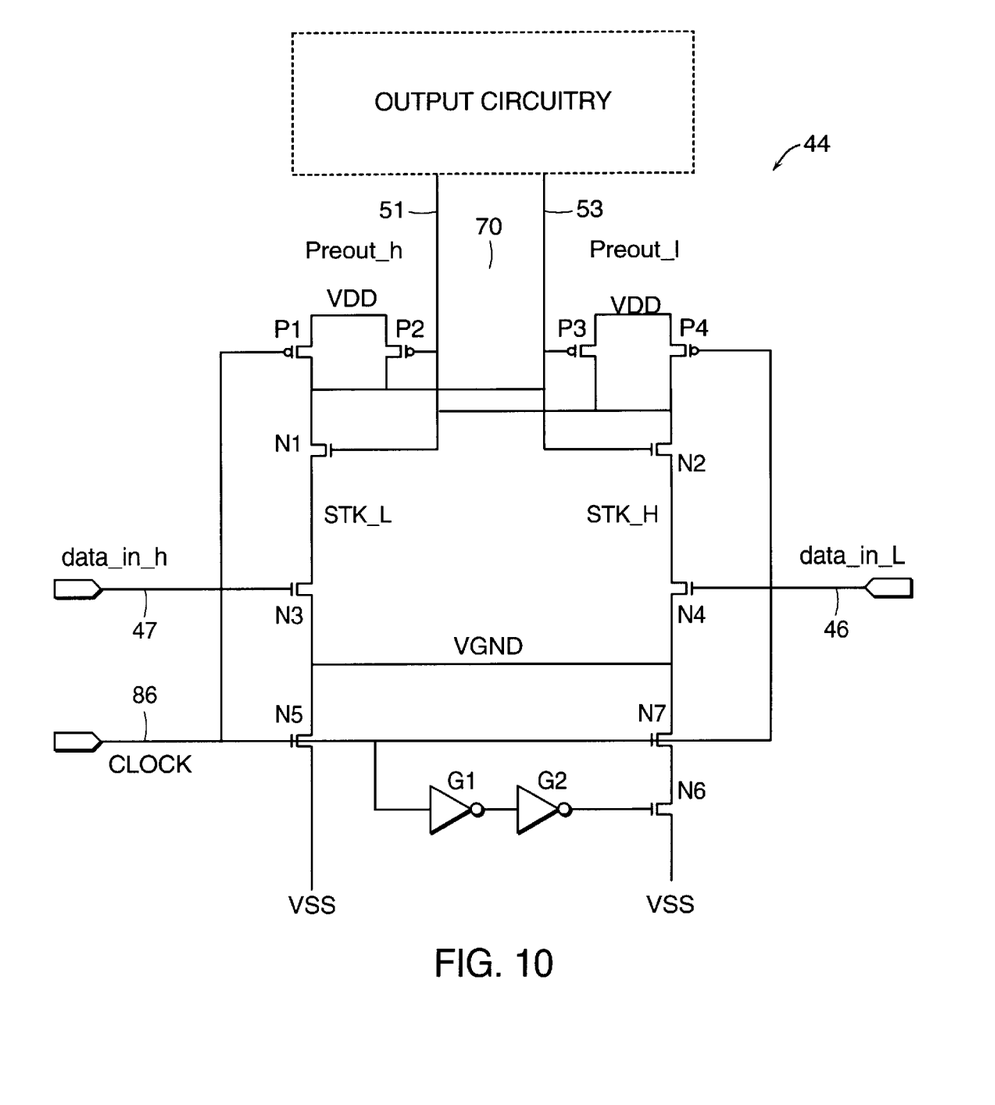
FIG. 10 is a schematic diagram of a further embodiment of the sense amplifier of FIG. 4.

Referring now to FIG. 10, a further embodiment of sense amplifier 44 is shown to include NMOS transistor N7 that prevents the flow of crossover current. Transistor N7 is connected in series between the drain of transistor N4 and the source of transistor N6, and has a gate terminal connected to clock signal 86. When clock signal 86 transitions from a logic high level to a logic low level, transistor N7 will be turned-off at approximately the same time as transistor N5 is turned-off. Therefore, unlike the embodiment of FIG. 5, the path from Vdd to Vss is closed before transistor N6 is turned-off and the crossover current is minimized. At the same time, the improved sensitivity of the sense amplifier of FIG. 5 is preserved.

It should be noted that the present invention can be incorporated into the sense amplifier described in co-pending Application "A Universal CMOS Single Input, Low Swing Sense Amplifier Without Reference Voltage", invented by Rob Dupcak, Randy Allmon and Mark Matson. Accordingly, the evaluate transistor of that sense amplifier can be replaced with the instant arrangement of evaluate transistors N5 and N6 and evaluate unit 77. With such a structure, evaluate transistors N5 and N6 will be fired at a time interval determined by evaluate unit 77. Accordingly, the sensitivity of the sense amplifier is improved.

It should be further noted that the present invention can be incorporated into the sense amplifier described in co-pending Application "A High Input Impedance Strobed CMOS Differential Sense Amplifier With Pre-Evaluate Charge Sharing on Complementary Nodes", invented by Daniel W. Bailey. Accordingly, the evaluate transistor of that sense amplifier can be replaced with the instant arrangement of evaluate transistors N5 and N6 and evaluate unit 77. With such a structure, evaluate transistors N5 and N6 will be fired at a time interval determined by evaluate unit 77. Accordingly, the sensitivity of the sense amplifier is improved.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A sense amplifier having improved sensitivity for sensing a logic level represented by a differential pair of data signals, comprising:

a first discharge circuit, coupled to a first internal signal of said sense amplifier, for allowing a charge stored on that first internal signal to be discharged at a first rate, said first rate being proportional to a voltage level of one of the data signals, said one of the data signals being isolated from said first discharge circuit such that a logic level associated with said one of said data signals is not affected by said discharge of said first internal signal;

a second discharge circuit, coupled to a second internal signal of said sense amplifier, for allowing a charge stored on that second internal signal to be discharged at a second rate, said second rate being proportional to a voltage level of another one of said data signals, said another one of the data signals being isolated from said second discharge circuit such that a logic level associated with said another one of said data signals is not affected by said discharge of said second internal signal; and an evaluate unit, connecting said first and second discharge circuits to an electrical ground, for conveying a first portion of said charges to said electrical ground at an initial rate and for conveying a second portion of said charges of said first and second internal signal to said electrical ground at a subsequent rate, wherein said evaluate unit conveys said electrical ground after a certain time delay has occurred since said first portion of said charges of said first and second internal signals is conveyed to said electrical ground, such that said sensitivity of said sense amplifier is improved.

2. A sense amplifier, as described in claim 1, wherein said first discharge circuit comprises:

a first transistor having a source terminal, a gate terminal and a drain terminal, said drain terminal connected to a pull-up unit, a second transistor having a drain terminal connected to said source terminal of said first transistor, a source terminal connected to said evaluate unit; and a gate terminal of said second transistor connected to a first one of said data signals for isolating said first data signal from said first discharge circuit such that a logic level on said first data signal is not affected by said discharge of said first internal signal.

3. A sense amplifier, as described in claim 2, wherein said first data signal is not connected to the source or drain terminals of said second transistor.

4. A sense amplifier, as described in claim 2, wherein said second discharge circuit comprises:

a third transistor having a source terminal, a gate terminal and a drain terminal, said drain terminal connected to said pull-up unit, a fourth transistor having a drain terminal connected to said source terminal of said third transistor, a source terminal connected to said evaluate unit; and a gate terminal of said fourth transistor connected to a second one of said data signals for isolating said second one of said data signals from said second discharge circuit such that said second data signal is not affected by said discharge of said second internal signal.

5. A sense amplifier, as described in claim 4, wherein said second data signal is not connected to the source or drain terminals of said fourth transistor.

6. A sense amplifier, as described in claim 4, further comprising:

a first output signal, connected to said gate of said first transistor and to said drain terminal of said third transistor and to said pull-up unit; and a second output signal, connected to said gate of said third transistor and to said drain terminal of said first transistor and to said pull-up unit.

7. A sense amplifier, as described in claim 1, wherein said evaluate unit includes:

a first evaluate transistor connected to said first and second discharge circuits and further connected to said electrical ground;

a second evaluate transistor, connected to said first and second discharge circuits and further connected to said electrical ground; and a delay unit, connected between a gate terminal of said first evaluate transistor and a gate terminal of said second evaluate transistor, for generating said certain time delay such that said second evaluate transistor is turned-on after said certain time delay has occurred since said first evaluate transistor is turned-on.

8. A sense amplifier, as described in claim 7, wherein said first evaluate transistor has a greater effective impedance than said second evaluate transistor such that said charges are discharged at said initial rate when said first evaluate transistor is turned-on.

9. A sense amplifier, as described in claim 8, wherein said charges are discharged at said subsequent rate when said second evaluate transistor is turned-on after said certain time delay.

10. A sense amplifier, as described in claim 9, wherein said initial rate is slower than said subsequent rate in order to increase a common mode rejection ratio of said sense amplifier.

11. A sense amplifier, as described in claim 1, wherein said differential pair of data signals are a pair of differential low voltage swing data signals such that an associated logic level is determined by sensing a voltage differential between those data signals.

12. A sense amplifier, as described in claim 1, wherein said differential pair of data signals are a pair of differential rail-to-rail voltage swing data signals such that a represented logic level is determined by sensing a voltage differential between those data signals.

13. A sense amplifier, as described in claim 10, wherein said delay unit comprises:

an even number of inverters connected in a serial manner between said gate of said first evaluate transistor and said gate of said second evaluate transistor.

14. A sense amplifier, as described in claim 4, wherein said second discharge circuit further comprises:

a fifth transistor connected in series between said fourth transistor and said evaluate unit, said fifth transistor being turned-on and turned-off at the same time as said first evaluate transistor such that a crossover current is minimized.

15. A sense amplifier, as described in claim 7, further comprising a clock signal connected to said gate terminal of said first evaluate transistor, said clock signal determining when to turn said first evaluate transistor on and off thereby determining when to begin discharging said charges.

16. A sense amplifier, as described in claim 1, further comprising a charge sharing device, coupled to said first internal signal and to said second internal signal for balancing a first charge, developed on said first internal signal, with a second charge, developed on said second internal signal, between times when said logic levels are imposed on said first and second data signals.

17. A computer system, comprising:

a central processing unit connected to a memory system by a system bus;

an I/O system, connected to the system bus by a bus interface device; and at least one sense amplifier for sensing a logic level of a pair of data signals, said sense amplifier comprising:

a first discharge circuit, coupled to a first internal signal of said sense amplifier, for allowing a charge stored on that first internal signal to be discharged at a first rate, said first rate being proportional to a logic level of one of the data signals, said one of the data signals being isolated from said first discharge path such that said logic level is not affected by said discharge of said first internal signal;

a second discharge circuit, coupled to a second internal signal of said sense amplifier, for allowing a charge stored on that second internal signal to be discharged at a second rate, said second rate being proportional to a logic level of another one of said data signals, said another one of the data signals being isolated from said second discharge circuit such that said logic level is not affected by said discharge of said second internal signal; and an evaluate unit, connecting said first and second discharge circuits to in electrical ground, for conveying a first portion of said charges of said first and second internal signals to said electrical ground at an initial rate and for conveying a second portion of said charges of said first and second internal signals to said electrical ground at a subsequent rate, wherein said evaluate unit conveys said second portion of said charges of said first and second internal signals to said electrical ground after a certain time delay has occurred since said first portion of said charges of said first and second internal signals is conveyed to said electrical ground, such that said sensitivity of said sense amplifier is improved.

18. A computer system, as described in claim 17, wherein said evaluate unit includes:

a first evaluate transistor connected to said first and second discharge circuits and further connected to said electrical ground;

a second evaluate transistor, connected to said first and second discharge circuits and further connected to said electrical ground; and a delay unit, connected between a gate terminal of said first evaluate transistor and a gate terminal of said second evaluate transistor for generating said certain time delay such that said second evaluate transistor is turned-on after said certain time delay has occurred since said first evaluate transistor is turned-on.

19. A computer system, as described in claim 18, wherein said first evaluate transistor has a greater effective impedance than said second evaluate transistor such that said charges are discharged at said initial rate when said first evaluate transistor is turned-on.

20. A computer system, as described in claim 19, wherein said charges are discharged at said subsequent rate when said second evaluate transistor is turned-on after said certain time delay.

21. A computer system, as described in claim 20, wherein said initial rate is slower than said subsequent rate in order to increase a common mode rejection ratio of said sense amplifier.

22. A computer system, as described in claim 21, wherein said first discharge circuit comprises:

a first transistor having a source terminal, a gate terminal and a drain terminal, said drain terminal connected to a pull-up unit;

a second transistor having a drain terminal connected to said source terminal of said first transistor, a source terminal connected to said evaluate unit; and a gate terminal of said second transistor connected to a first one of said data signals for isolating said first one of said data signals from said first discharge circuit such that said first one of said data signals is not affected by said discharge of said first internal signal.

23. A computer system, as described in claim 22, wherein said first one of said data signals is not connected to the source or drain terminals of said second transistor.

24. A computer system, as described in claim 22, wherein said second discharge circuit comprises:
- a third transistor having a source terminal, a gate terminal and a drain terminal, said drain terminal connected to said pull-up unit;
- a fourth transistor having a drain terminal connected to said source terminal of said third transistor, a source terminal connected to said evaluate unit; and
- a gate terminal of said fourth transistor connected to a second one of said data signals for isolating said second one of said data signals front said second discharge circuit such that said second one of said data signals is not affected by said discharge of said second internal signal.

25. A computer system, as described in claim 24, wherein said second one of said data signals is not connected to the source or drain terminals of said fourth transistor.

26. A computer system, as described in claim 24, further comprising:
- a first output signal, connected to said gate of said first transistor and to said drain of said third transistor and to said pull-up unit; and
- a second output signal, connected to said gate of said third transistor and to said drain of said first transistor and to said pull-up unit.

27. A sense amplifier having improved sensitivity for sensing a logic level represented by a differential pair of data signals, comprising:
- a first discharge circuit, coupled to a first internal signal of said sense amplifier, for allowing a charge stored on that first internal signal to be discharged at a first rate, said first rate being proportional to a voltage level of one of the data signals, said one of the data signals being isolated from said first discharge circuit such that a logic level associated with said one of said data signals is not affected by said discharge of said first internal signal;
- a second discharge circuit, coupled to a second internal signal of said sense amplifier, for allowing a charge stored on that second internal signal to be discharged at a second rate, said second rate being proportional to a level of a power supply voltage that supplies power to said sense amplifier; and
- an evaluate unit, connecting said first and second discharge circuits to an electrical ground, for conveying a first portion of said charges of said first and second internal signals to said electrical ground at an initial rate and for conveying a second portion of said charges of said first and second internal signals to said electrical ground at a subsequent rate, such that said sensitivity of said sense amplifier is improved.

28. A sense amplifier, as described in claim 27, wherein said evaluate unit conveys said second portion of said charges of said first and second internal signals to said electrical ground after a certain time delay has occurred since said first portion of said charges of said first and second internal signals is conveyed to said electrical ground.

29. A method for improving the sensitivity of a sensing operation such that a logic level, represented by a differential pair of data signals, is determined, said method comprising:
- allowing a charge stored on a first internal signal of said sense amplifier to be discharged at a first rate, said first rate being proportional to a voltage level of one of the data signals;
- isolating said one of the data signals from a first discharge path such that said logic level is not affected by said discharge of said first internal signal;
- allowing a charge stored on a second internal signal of said sense amplifier to be discharged at a second rate, said second rate being proportional to a voltage level of another one of said data signals;
- isolating said another one of the data signals from a second discharge path such that said logic level is not affected by said discharge of said second internal signal;
- conveying, by an evaluate unit connecting said first and second discharge paths to an electrical ground, a first portion of said charges of said first and second internal signals to said electrical ground at an initial rate; and
- conveying, by said evaluate unit, a second portion of said charges of said first and second internal signals to said electrical ground at a subsequent rate, such that said sensitivity of said sense amplifier is improved, said second portion of said charges of said first and second internal signals being conveyed to said electrical ground after a certain time delay has occurred since said first portion of said charges of said first and second internal signal is conveyed to said electrical ground.

30. The method for improving the sensitivity of a sensing operation, as described in claim 29, wherein said evaluate unit includes:
- a first evaluate transistor connected to said first and second discharge paths and further connected to said electrical ground;
- a second evaluate transistor, connected to said first and second discharge paths and further connected to said electrical ground; and
- a delay unit, connected between a gate terminal of said first evaluate transistor and a gate terminal of said second evaluate transistor, for generating said certain time delay such that said second evaluate transistor is turned-on after said certain time delay has occurred since said first evaluate transistor is turned-on.

31. The method for improving the sensitivity of a sensing operation, as described in claim 30, wherein said first evaluate transistor has a greater effective impedance than said second evaluate transistor such that said charges are discharged at said initial rate when said first evaluate transistor is turned-on.

32. The method for improving the sensitivity of a sensing operation, as described in claim 31, wherein said charges are discharged at said subsequent rate when said second evaluate transistor is turned-on after said certain time delay.

33. The method for improving the sensitivity of a sensing operation, as described in claim 32, wherein said initial rate is slower than said subsequent rate in order to increase a common mode rejection ratio of said sense amplifier.

34. A sense amplifier having improved sensitivity, for sensing a logic level represented by a differential pair of data signals, comprising:
- a first means for allowing a charge stored on a first internal signal of said sense amplifier to be discharged at a first rate, said first rate being proportional to a voltage level of one of the data signals, the first means isolating said one of the data signals from a first discharge path such that said logic level is not affected by said discharge of said first internal signal;
- a second means for allowing a charge, stored on a second internal signal of said sense amplifier, to be discharged at a second rate, said second rate being proportional to a voltage level of another one of said data signals, said second means isolating said another one of the data signals from a second discharge path such that said logic level is not affected by said discharge of said second internal signal;

a means for conveying a first portion of said charges of said first and second internal signals to an electrical ground at an initial rate and for conveying a second portion of said charges of said first and second internal signals to said electrical ground at a subsequent rate, such that said sensitivity of said sense amplifier is improved, said second portion of said charges of said first and second internal signals being conveyed to said electrical ground after a certain time delay has occurred since said first portion of said charges of said first and second internal signals is conveyed to said electrical ground.

35. The sense amplifier, as described in claim 34, wherein said means for conveying comprises:

a first transistor means connected to said first and second discharge means and further connected to said electrical ground;

a second transistor means, connected to said first and second discharge means and further connected to said electrical ground; and a means for generating said certain time delay such that said second transistor means is turned-on after said certain time delay has occurred since said first transistor means is turned-on.

36. The sense amplifier, as described in claim 35, wherein said first transistor means has a greater effective impedance than said second transistor means such that said charges are discharged at said initial rate when said first transistor means is turned-on.

37. The sense amplifier, as described in claim 36, wherein said charges are discharged at said subsequent rate when said second transistor means is turned-on after said certain time delay.

38. The sense amplifier, as described in claim 37, wherein said initial rate is slower than said subsequent rate in order to increase a common mode rejection ratio of said sense amplifier.

* * * * *

UNITED STATES PATENT AND TRADEMARK OFFICE
CERTIFICATE OF CORRECTION

PATENT NO. : 6,107,839
DATED : August 22, 2000
INVENTOR(S) : Jeff L. Chu, Daniel W. Bailey and Jason F. Cantin It is certified that error appears in the above-identified patent and that said Letters Patent is hereby corrected as shown below:

In claim 1, column 10, line 17, after "conveys said," insert ---second portion of said charges of said first and second internal signals to said---.

In claim 17, column 12, line 16, change "in" to ---an---.

In claim 24, column 13, line 13, change "front" to ---from---.

Signed and Sealed this

Seventeenth Day of April, 2001

*Attest:*

NICHOLAS P. GODICI

*Attesting Officer*   *Acting Director of the United States Patent and Trademark Office*